United States Patent
Collins et al.

(10) Patent No.: US 6,507,519 B1
(45) Date of Patent: Jan. 14, 2003

(54) BUFFER CIRCUIT

(75) Inventors: Stephen Collins, Oxford (GB); Gillian F Marshall, Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/646,217

(22) PCT Filed: Mar. 19, 1999

(86) PCT No.: PCT/GB99/00873
§ 371 (c)(1),
(2), (4) Date: Sep. 15, 2000

(87) PCT Pub. No.: WO99/49521
PCT Pub. Date: Sep. 30, 1999

(30) Foreign Application Priority Data

Mar. 20, 1998 (GB) ................................................ 9806094

(51) Int. Cl.$^7$ ............................................... G11C 16/04
(52) U.S. Cl. ............................. 365/185.28; 365/185.14
(58) Field of Search ....................... 365/185.28, 185.14, 365/185.01

(56) References Cited

U.S. PATENT DOCUMENTS

| | | | | |
|---|---|---|---|---|
| 4,829,203 A | * | 5/1989 | Ashemore, Jr. | 365/185.1 |
| 5,541,402 A | * | 7/1996 | Ackland et al. | 250/208 |
| 5,943,268 A | * | 8/1999 | Nguyen | 365/185.29 |
| 6,014,044 A | * | 1/2000 | Kramer et al. | 327/81 |
| 6,141,243 A | * | 10/2000 | Aslam et al. | 365/185.01 |

FOREIGN PATENT DOCUMENTS

| | | |
|---|---|---|
| EP | 0 626 784 A | 11/1994 |
| EP | 0 708 554 A | 4/1996 |
| WO | WO 97/21304 | 6/1997 |

OTHER PUBLICATIONS

Ricouier N et al: "Random Addressable CMOS Image Sensor for Industrial Applications" Sensors and Actuators A, vol. A44. No. 1. Jul. 1, 1994. pp. 29–35. XP000469151 see p. 30: figures 1.3.

* cited by examiner

Primary Examiner—Hoai Ho
(74) Attorney, Agent, or Firm—Nixon & Vanderhye P.C.

(57) ABSTRACT

A buffer circuit includes a MOSFET source follower (M54) and a floating gate MOSFET (MFG53) connected in series with the phototransistor (PT51) to control current through it at an input circuit node (D53). The source follower (M54) buffers the phototransistor (PT51), having a gate (G54) connected to its emitter (PC51). The floating gate (F53) is programmable with charge to preset the phototransistor current under prearranged illumination conditions to counteract unwanted signal contributions (e.g. fixed pattern noise) or non-optimum circuit characteristics. The floating gate MOSFET (MFG67) may alternatively be connected in series with the source follower output (D65) to control current at an output circuit node. The circuit may be a member of a pixel circuit array and may include programming circuitry (M84, M85) to select it for programming and to isolate it to enable other array members to be programmed.

27 Claims, 4 Drawing Sheets

BUFFER CIRCUIT

This invention relates to a buffer circuit of the kind incorporating a metal oxide-silicon field-effect transistor (MOSFET) for use in buffering circuits and sensors such as photosensitive elements and other transducers.

Buffer circuits are well known for the purposes of isolating sources of weak signals, sensitive circuitry or components, particularly (although not exclusively) in the field of sensors such as radiation detectors. Use of MOSFETs in buffer circuits is disclosed in U.S. Pat. No 4,808,822 to Manning and Watton, which relates to a thermal detector comprising one or more rows of pyroelectric elements. The elements develop output signals in response to modulated radiation from a thermal scene. The or each row has a respective common row output line for output signals from all elements in the row. Each element is buffered from the output line by a respective power amplifier in the form of a MOSFET source follower; this avoids loss of signal arising from the much greater capacitance of the row output line (~30 pf) compared to that of each element (~1 pF), which would otherwise have a potential divider effect and reduce the output signal by more than an order of magnitude.

The buffer circuit of U.S. Pat. No. 4,808,822 suffers from the disadvantage that there may be variation between the properties of individual MOSFETs (eg threshold voltages) which would introduce false contrast into the image. More importantly, it has no effect on a fundamental problem in pyroelectric detector arrays, an unwanted signal component known as fixed pattern noise. This arises from the differing thermal response characteristics of the detector elements; if the elements were perfectly matched, exposing them to a constant temperature background should result in output signals which are equal to one another, but this is very far from the case; instead there is a variation between element output signals which is very much larger than that of image contrast associated with a typical ambient thermal scene. To deal with this it is necessary to store successive image frames associated respectively with dark field (scene obscured) and light field (scene unobscured) conditions, and to subtract the former from the latter. This must be done very acurately to obtain the required scene contrast component, which is small and can be lost in subtraction error.

A similar problem occurs with radiation detetors of semiconductor material, such as for example that described in U.S. Pat. No. 5,155,348 to Ballingall and Blenkinsop. This patent relates to a readout circuit for a photodiode; the circuit stores a photodiode output signal produced in a calibration phase for later use in subtraction from another output signal obtained in a measurement phase. Here again the purpose is to remove a very large unwanted signal component as soon as possible in processing to avoid burdening later circuitry with requirements for processing capacity and accuracy. The scale of the problem is illustrated in the field of photoconductive detectors, where the bias voltage on such a device in operation is in the region of 1 volt, radiation from an ambient thermal scene at 290 K gives a signal in the order of 1 millivolt, and scene contrast (ie the required image information) is a few microvolts. The problem of detecting small signals in the presence of very large offsets has been appreciated for many years, and reducing the processing circuitry needed to achieve this is a long-felt want.

It is an object of the present invention to provide an alternative form of buffer circuit suitable for programming to counteract offsets, mismatches and the like.

The present invention provides a buffer circuit including a MOSFET power amplifier buffer (eg a source follower) and a second MOSFET arranged to control current through an input or output node of the circuit, characterized in that the second MOSFET has a floating gate on which charge is storable to change circuit properties and the circuit has means for storing charge on the floating gate.

Floating-gate MOSFETs are known, as described for example in U.S. Pat. No. 5,557,234 to Collins, and generally as outlined by Sze in "Physics of Semiconductor Devices", 2nd Ed. Wily 1981, page 496. In IEEE Electron Device Letters Vol 12, No. 3, March 1991, Thomsen et al estimate that a floating gate in a silicon MOSFET would lose its charge at the rate of 0.1% in 26 years, which means that for practical purposes charge is retained undiminished on the gate permanently unless reprogrammed.

The invention provides the advantage that storing charge on the floating gate alters the threshold voltage of the MOSFET and hence also its channel conductivity, enabling the current through an input or output circuit node to be preset for a predetermined input signal; it provides a mechanism for altering circuit properties if required to trim either a single circuit or an array of like circuits to obtain required or matched operating characteristics. Alternatively, it may be used to counteract an unwanted contribution to the circuit input signal.

There are a number of techniques for charging or programming the floating gate of the second MOSFET. One technique is described in U.S. Pat. No. 5,557,234 for a MOSFET having a window through which ultraviolet (UV) light can be applied to an insulation layer between the MOSFET floating gate and its control gate. When a voltage is placed on the control gate, the insulation layer is UV illuminated and becomes conducting allowing charge to be transferred from the control gate to the floating gate. Hot electron injection or Fowler-Nordheim tunnelling may also be employed for charging the floating gate.

The second MOSFET may be connected in series with a sensor itself connected to the input node, the second MOSFET being used to counteract unwanted sensor characteristics. The circuit may be part of an array of like circuit associated with respective sensors and providing means for counteracting differences between the characteristics of the sensors or of the circuits themselves. The sensors may be (but are not limited to) radiation sensors such as pyroelectic elements, photoconductors, phototransitors or photodiodes. Each circuit may be trimmable by storage of charge on its respective floating gate to conform to a common output criterion.

The second MOSFET may be connected in series with a sensor and arranged to control current through the latter. It may have a control gate and a drain which are connected together to provide capacitative coupling between the drain and floating gate via the control gate. The MOSFET power amplifier may be a source follower and the sensor a phototransistor with an emitter connected to the second MOSFET drain, which in may be connected to a gate of the source follower, which may be in series with a switch (M55) actuatable to relay source follower output signals to an output.

The circuit may be switchable between on and off states, the source follower being switched on only when read-out is required.

In one embodiment, the second MOSFET has a control gate and the buffer circuit is:

a) a member of an array of like circuit, b) selectable to store charge on the floating gate during a programming operation, and c) deselectable to avoid storage of charge on the floating gate during a programming operation associated with another circuit of the array.

In a further embodiment, the MOSFET power amplifier is a source follower with a gate connected to receive signals from a phototransistor in series with a load comprising at least one diode-connected MOSFET, the second MOSFET is arranged to control current though an output circuit node comprising a source of the source follower and is in series with the source follower and a switch, and the switch is actuatable to select the circuit and relay output signals from it to a circuit output.

Alternatively the second MOSFET may be connected as a load of the MOSFET power amplifier arranged as a source follower, and may be arranged in series with a switch to control current through an output circuit node comprising a source of the source follower, and the switch and the second MOSFET being actuatable jointly to select the circuit and provide for output signals from it to pass to a circuit output.

The buffer circuit of the invention may a member of an array of like source follower circuit which are trimmable by storage of charge on respective floating gates and the means for storing charge comprises programming means arranged both to store charge on the respective second MOSFET floating gate in response to programming intended for that circuit and to densensitise it to programming intended for another circuit.

In another aspect, the invention provides a method of trimming buffer circuit characterized in that it comprises the steps of:

a) providing a buffer circuit incorporating a MOSFET power amplifier buffer and a second MOSFET arranged to control current through an input or output node of the circuit, the second MOSFET having a floating gate on which charge is storable to change circuit properties;

b) adjusting the charged stored on the floating gate coarsely by at least one of hot electron injection, Fowler-Nordheim tunnelling and ultraviolet illumination until the circuit provides an output approximating to a required output;

c) adjusting the charge stored on the floating gate finely by application of less than one hundred pulses of more than 1 second's duration to an injector or control gate of the second MOSFET.

The method of the invention is applicable when the circuit is a member of an array of like circuits, and in this case it may include the step of desensitising circuit to adjustment when not required by applying to a control gate of the second MOSFET a deselect voltage greater in magnitude than a supply voltage of the circuit.

The method of the invention is also applicable when the circuit is a pixel circuit for an imaging system, and in this case adjustment in step (c) may be carried out when the pixel is illuminated with radiation corresponding to the middle of its dynamic range on a logarithmic scale, or alternatively with radiation corresponding to a low ambient light level.

In an alterative aspect, the invention provides a method of trimming a buffer circuit characterized in that it comprises the steps of:

a) providing a buffer circuit incorporating a MOSFET power amplifier buffer and a second MOSFET arranged to control current through an input or output node of the circuit, the second MOSFET including a floating gate on which charge is storable to charge circuit properties; and b) adjusting the charge stored on the floating gate until the circuit has an output voltage which is differs from a required output voltage by an error voltage $\delta V$, where:

$$\delta V = \frac{C_{inj} V_{inj}}{C_{TOT}},$$

$C_{inj}$ is the capacitance between the floating gate and a second MOSFET component employed to store charge on the floating gate (F67), $V_{inj}$ is the voltage on that component and $C_{TOT}$ is the total floating-gate capacitance.

In order that the invention might be more fully understood, embodiments thereof will now be described by way of example only and with reference to the accompanying drawings, in which:

FIG. 1 is a diagram of a MOSFET source follower circuit with programmable current at an output node;

FIG. 2 schematically illustrates a prior art pixel array for an imaging system;

As already mentioned, the basic problem with which this invention is concerned is the variation in signals associated with MOSFET power amplifiers such as source followers and their associated circuitry due to unwanted contribution to their input signals and variations in the characteristics of the active devices making up the circuitry. The invention seeks to overcome these problems by incorporating a floating gate MOSFET with programmable floating gate charge to counteract unwanted effects.

Unfortunately, a floating gate device has a lower transconductance $g_m$ than the comparable MOSFET. Thus, using a floating gate device directly as the source follower would give a programmable threshold voltage, but, at the cost of degrading the gain of the circuit. A better solution in accordance with the invention is to provide a programmable current source for the source follower using a floating gate MOSFET.

Figure 1:
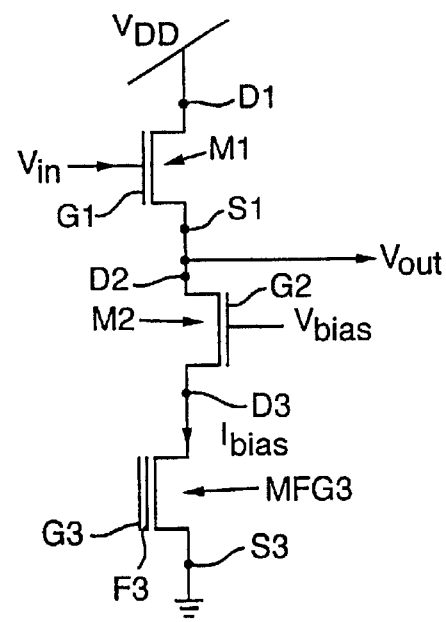

Referring to FIG. 1, a source follower circuit is shown including a first n-channel MOSFET M1 having a source S1, a gate G1 and a drain D1 connected as a source follower, an input voltage $V_{in}$ being connected to the gate G1 and an output voltage $V_{out}$ appearing at the source S1. A supply voltage $V_{DD}$ is connected to the drain D1. The MOSFET M1 is connected in a series arrangement with two other MOSFETs, a second n-channel MOSFET M2 and a floating gate MOSFET MFG3; the second MOSFET M2 has a drain D2 connected to the source S1 and a gate G2 connected to a bias voltage $V_{bias}$; $V_{bias}$ is set at a value which provides for the MOSFET M2 to operate in saturation. The MOSFET M2 also has a source S2 connected to a drain D3 of the floating gate MOSFET MFG3, which itself has a floating gate F3, an unconnected input gate G3 and an earthed source S3. In operation the source follower MOSFET M1 has drain-source current $I_{bias}$ controlled by the floating-gate MOSFET MFG3, which acts as a constant current sink with current programmed by charge stored on its floating gate F3 by a process to be described later. The second MOSFET M2 provides isolation between the floating gate MOSFET drain D3 and first MOSFET source S1 at which the output voltage $V_{out}$ appears; this avoids changes in $V_{out}$ affecting $I_{bias}$.

The source follower circuit shown in FIG. 1 is trimmed by adjusting the charge on the floating gate F3; alteration of the floating gate charge alters the threshold voltage of the MOSFET MFG3 and trims $I_{bias}$ to a level appropriate to the envisaged application, eg counteracting unwanted contributions to the input signal $V_{in}$ or variations between characteristics of different source follower circuits in an array.

The invention will next be described in relation to its use in electronic cameras in order to illustrate an alternative way of connecting the floating-gate device into the source-follower and its associated circuitry.

CCD based sensors currently dominate the electronic camera market. However, they are more costly both to make and to integrate into a system than conventional CMOS chips. The result is that the cost of these cameras precludes their use in cost sensitive consumer markets. There is therefore considerable commercial interest in developing affordable visible-band cameras which can be bundled with standard consumer PCs. Furthermore, these cameras could then be employed in a range of products such as digital stills and video cameras.

More recent development has been directed towards cameras which have a linear response and which are thus a direct replacement for CCD cameras. However, at least is one company has created a CMOS camera with a logarithmic response as an unavoidable consequence of a desire to create a randomly addressable, non-integrating camera.

Figure 2:
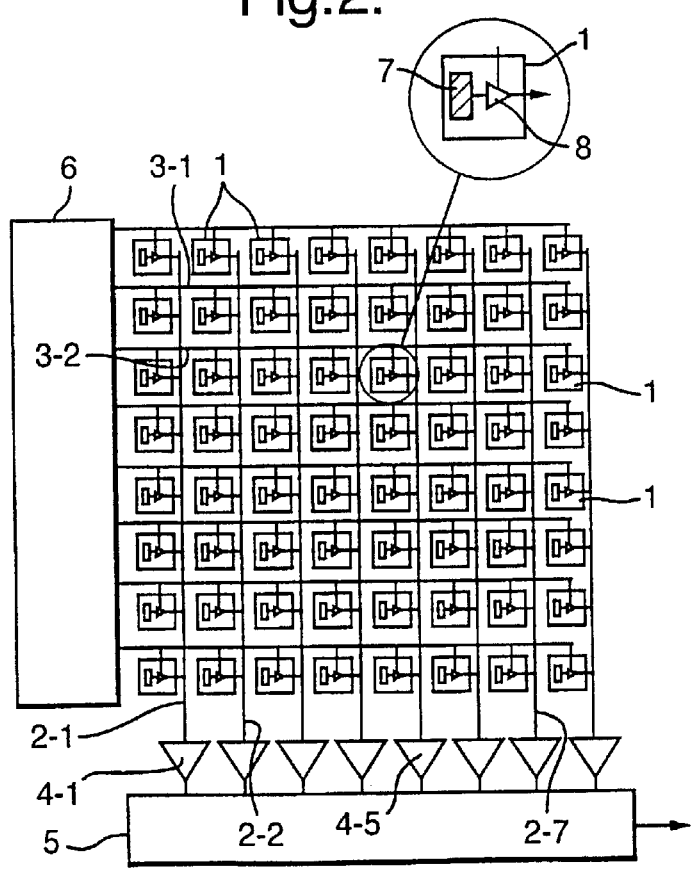

This camera comprises a two-dimensional addressable array of sensors 1, as shown in FIG. 2. A bit line 2-1, 2-2 etc., is associated with each column of sensors 1 and a row-enable line 3-1, 3-2 etc., is associated with each row of sensors 1. The output from each bit line is amplified in a respective amplifier 4-1, 4-2 etc., before being passed to one input of a column decode multiplexer 5 so that a whole column can be addressed at any one time. A row decode circuit 6 is operable to switch every sensor 1 in a selected row to place its output on its respective bit line 2-1, 2-2 etc. The multiplexer 5 addresses the columns individually and, in this way, the output from individual sensors can be selected. In operation, individual sensors may be scanned in a conventional manner to achieve a composite picture signal at the output of the multiplexer 5 which is subject to firer conventional processing.

Figure 3:
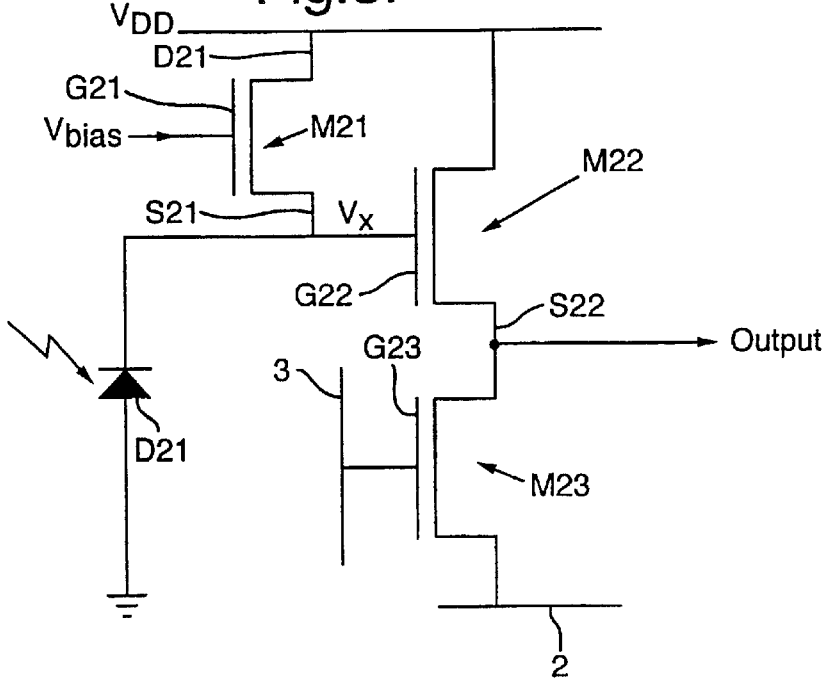
FIG. 3 is a prior art pixel circuit used in the FIG. 2 pixel array.

As illustrated schematically in the enlargement in FIG. 2, each sensor 1 comprises a light sensitive CMOS element 7—eg a photodiode or phototransistor—and a buffer 8. A full prior art pixel circuit, as used in the known array of FIG. 2, is shown in FIG. 3 and comprises a photodiode D21 in series with an n-channel MOSFET load transistor M21, which has a source S21, gate G21 and drain D21. A fixed bias voltage $V_{bias}$ is applied to the gate G21. The photodiode D21 responds to incident radiation by producing an output voltage $V_x$ at the source S21, which is applied to an input gate G22 of an n-channel MOSFET M22 connected as a source-follower. The MOSFET M22 has a source S22 (at which the source-follower output appears) connected via an n-channel MOSFET switch M23 to a respective bit line 2 (2-1, 2-2 etc in FIG. 2). The MOSFET switch M23 is switched by a signal applied to its gate G23 from a respective row-enable line 3 (3-1, 3-2 etc in FIG. 2).

In operation, radiation indicated by an arrow falls on the photodiode D21, which responds by producing an output photo-current $I_{photo}$; this current is sourced from the source of the load transistor M21 which a known gate voltage $V_{bias}$. Since typical photocurrent is less than 1 micro-amp, the load transistor M21 operates in a sub-threshold regime with a current-voltage relation given by:

$$I_{ds} = I_o \exp[V_{gs}/nU_T] \quad (1)$$

where $I_{ds}$ is the drain-source current, $V_{gs}$ is the gate-source voltage, $U_T = kT/q$ and $I_o$ and n are device parameters. Within this circuit the gate voltage is held constant, and consequently the source voltage responds to changes in the input current. The output characteristics are be determined by substituting $V_{gs} = V_{bias} - V_x$ so that $$V_x = V_{bias} - n.U_T \ln[I_{photo}/I_o] \quad (2)$$

The current flowing in the pixel circuit is too small to provide a useful signal if applied directly to the large capacitance associated with a respective common output line 2-1, 2-2 etc used to read data from an way of photosensors. The source follower MOSFET M22 buffers the pixel circuit from the common output line to enable useful output signal levels to be developed.

Ideally, the source-follower ensures that the output line voltage is linearly dependent upon the pixel output voltage $V_x$. If so, it is the sub-threshold load M21 which gives the logarithmic response. Since the transistor M21 can be designed to remain in sub-threshold whilst the photo-current varies by 6 orders of magnitude, the pixel circuit will be logarithmic over a wide dynamic range of incident radiation intensity. It is this very wide dynamic range which makes the logarithmic detector suitable for imaging external scenes.

Furthermore, detectors with a logarithmic response are a key part of silicon retina circuits. Although silicon retinas were primarily designed to enable investigations into the function of the mammalian retina, experiments have shown that the logarithnic response is critical to creating robust reliable object recognition.

A logarithmic camera of this type has several potential advantages, but it has one major disadvantage. The variations between the active devices in different pixels create a random variation in the pixel responses. The typical peak-to-peak variations (fixed pattern noise) are said to be between 100 mV and 130 mV for a sensor whose sensitivity is 40–50 mV per decade of light intensity. This means that fixed pattern noise is equivalent to two orders of magnitude change in photon flux incident on the photodiode D21. These random variations will therefore obscure contrast in the scene and significantly increase the output dynamic range required to image a scene.

Although linear CMOS detector arrays have the same problem of variation between pixels, a technique known as correlated double sampling can be employed to perform calibration. This is not possible with the logarithmic pixel circuit. One method which has been considered involves inducing a threshold voltage shift in the source-follower device which compensates for variations between pixels (see N. Ricquier and B. Dierickx, "Active pixel CMOS image sensor with on-chip non-uniformity correction"; IEEE Workshop on CCD and Advanced Image Sensors 1995). In the 2.4 micron process they used for a test chip, the threshold voltage shift was induced by damaging the source-follower device. Although the desired functionality could be demonstrated, the process was too slow for commercial applications. In practice, it appears that correction for variations between pixels will either be performed outside the camera or by changing the pixel to create a sensor with a linear response which can be corrected. The first approach will increase the cost of the camera, whilst the second approach will destroy the logarithmic response required to get both a high dynamic range and robust object recognition.

Figure 4:
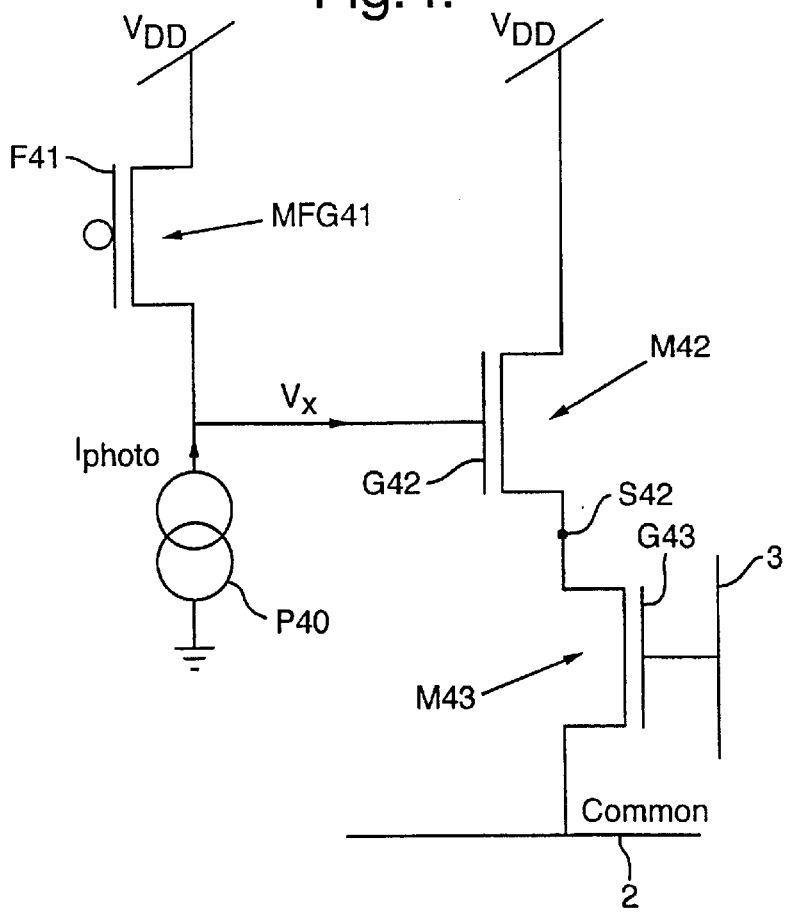
FIGS. 4 and 5 are diagrams of MOSFET source follower circuit each with current programmable at a respective input node.

Referring now to FIG. 4, there is shown an alternative to the circuit of FIG. 3 for use with the FIG. 2 array. In the circuit of FIG. 4, the photodiode D21 is replaced by a photosensor P40 in the form of a generalised light sensitive source of a current $I_{photo}$, and the MOSFET M21 is replaced by a p-channel floating-gate MOSFET MFG41 having a floating gate F41. FIGS. 3 and 4 are otherwise alike, and equivalent elements therein are like-referenced with reference prefix 40 replacing 20 (eg M42/M22). FIG. 4 therefore includes a MOSFET source-follower M42 in series with a MOSFET switch M43, the latter being used for switching source-follower out put signals on to the output line 2. The floating gate MOSFET MFG41 provides two consequences: firstly, it can be programmed by charging its floating gate F41 to obtain a predetermined output signal in response to a given intensity of radiation incident on the photosensor P40; this allows all pixel source follower circuits in an array to be programmed for example to give like response to like incident radiation intensity. It may also be used to remove fixed pattern noise arising from differing response characteristics of photosensors associated with different circuits or alternatively variation between the characteristics of the circuits themselves.

The second consequence of replacing the MOSFET M21 by the floating gate MOSFET MFG41 arises in connection with the change in device type, which means that the potential on the floating-gate F41 must change in order to allow the photocurrent to flow. The mechanism for changing the floating gate potential is the small parasitic coupling capacitance, $C_{para}$, between drain and gate which exists within all MOSFETs. For a change $\Delta V_x$ in the potential $V_x$ on the gate of the source-follower transistor M42, the change in floating-gate potential $\Delta V_{fg}$ is:

$$\Delta V_{fg} = C_{para} \Delta V_x / C_{TOT} \quad (3)$$

where $C_{TOT}$ is the total capacitance associated with the floating-gate F42, and comprises contributions between the floating gate and the source, drain, control gate, charge injector and substrate respectively.

One of the problems of any high impedance node, such as the floating gate, is that it can be capacitatively coupled to transient signals such as the digital select signal which is fed into every pixel. The effects of this can be minimised by shielding the floating gate from these transient signals using features which are held at a constant voltage. For example the floating-gate device can additionally incorporate a control gate, having an exterior connection, which can thus be maintained at ground, or some other suitable potential, in order to shield the floating gate. In addition, for predictable transients, such as the select signals, the read-out operation can be phase-locked to the transient in an attempt to ensure that the disturbance is the same on each pixel.

Procedures for introducing charge on to the floating gates F3 and F41 in FIGS. 1 and 4 will be described later.

Immediately after manufacture of circuits such as those shown in FIGS. 1 and 4, each MOSFET floating gate F3 or F41 will store an arbitrary charge and will therefore be at an arbitrary voltage. Before any programming is undertaken the floating gates are preferably discharged to a relatively well-known initial condition. For example, as is known from the prior art, ultraviolet radiation may be used to cause conduction in a layer insulating a floating gate F3 from a biasable circuit element such as a control gate G3 of the MOSFET, which moves the former to the voltage of the latter. Floating gates may therefore be initialised by exposure to ultraviolet radiation. Since most of a camera chip is shielded by a metal layer a hole or window is required through the layer to give access for radiation to illuminate the insulation layer.

Figure 5:
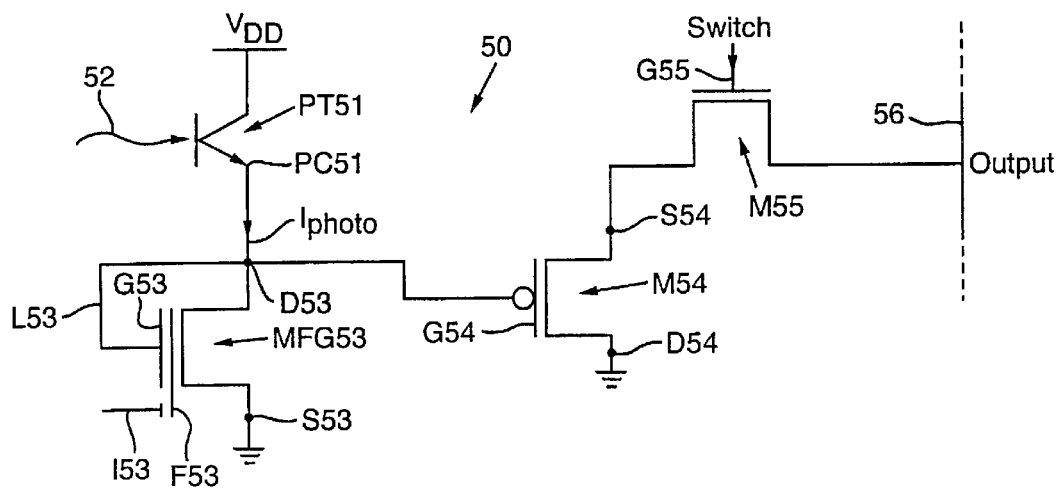

Referring now to FIG. 5, there is shown an embodiment of the invention in the form of a pixel circuit indicated generally by 50. The circuit 50 is constructed on similar principles to that of FIG. 4, in that it enables current to be preset at an input circuit node for defined illumination conditions. It includes an input circuit portion comprising an npn phototransistor PT51 illuminated with radiation indicated by an arrow 52, and is connected in series with a floating gate MOSFET MFG53 having a source S53, floating gate F53, control gate G53, charge injector I53 and drain D53. The source S53 is earthed, the control gate C53 and drain D53 are connected to one another by a line L53, and both gate C53 and drain D53 are connected to the phototransistor emitter PC51.

The circuit 50 also includes an output circuit portion comprising a p-channel MOSFET source follower M54 having a source S54, gate G54 and drain D54; the gate G54 is connected to the floating gate MOSFET's drain D53, the drain D54 is earthed, and the source S54 is connected to a MOSFET switch M55 which is in series with the source follower M54. The switch M55 is actuated by a signal on its gate G55 enabling source follower output signals to be switched to an output line 56.

The mode of operation of the circuit 50 is as follows. Radiation incident on the phototransistor PT51 causes a photocurrent $I_{photo}$ to flow as its collector current and also in the floating gate MOSFET MFG53 as the latter's drain-source current. For any particular value of incident radiation intensity, the magnitude of the voltage at the floating gate MOSFET drain D53 is controlled by the MOSFET channel conductivity, and hence by the charge on the floating gate F53. The floating gate charge is therefore trimmed so that a prearranged radiation intensity incident on the phototransistor PT51 gives rise to predetermined voltage at the floating gate MOSFET drain D53. The circuit 50 is switched on by operation of the switch M55 in response to application of a voltage to its gate G55; drain current then flows in the source follower MOSFET M54, and the voltage at the drain D53 of the floating gate MOSFET MFG53 becomes switched via the source follower M54 to the circuit output line 56.

The circuit 50 is equivalent to that of FIG. 4 with reversal of the channel polarities of the floating gate and source follower MOSFETs MFG53 and M54, together with the insertion of the connection L53 between control gate G53 and drain D53. This connection has the effect of wiring the capacitance $C_{cgfg}$ between the control gate G53 and floating gate F53 in parallel with the capacitance $C_{para}$ between the floating gate F53 and drain D53, to which Equation (3) refers. For a change $\Delta V_x$ in the gate potential $V_x$ of the source-follower transistor M65, the change in potential $\Delta V_{fg}$ on the floating gate F53 is given by amending Equation (3) to replace $C_{para}$ by $(C_{cgfg}+C_{para})$ producing:

$$\Delta V_{fg} = (C_{cgfg} + C_{para}) \Delta V_x / C_{TOT} \quad (4)$$

where $C_{TOT}$ is the total capacitance associated with the floating-gate F53, and comprises contributions between the floating gate and the source, drain, control gate, injector and substrate respectively. Equation (4) shows that the mechanism for changing the potential of the floating gate F53 has become the sum of the coupling capacitances $C_{cgfg}+C_{para}$ between the drain D53 and both gates G53 and F53. To maximise sensitivity, ie to maximise change of output voltage in response to change in photocurrent, this coupling should be as small as possible.

Figure 6:
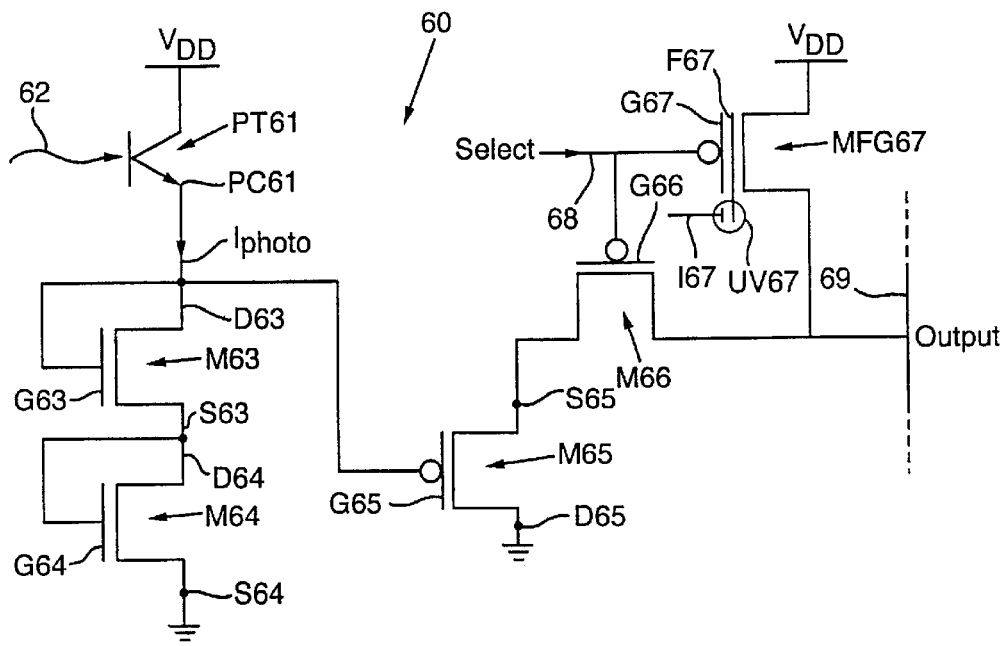
FIGS. 6 and 7 are diagrams of alternative forms of circuit with programmable current at output nodes.

Referring now to FIG. 6, there is shown a further embodiment of the invention in the form of a pixel circuit indicated generally by 60. As in the circuit of FIG. 1, the circuit 60 enables current to be preset at an output circuit node. It has an input circuit portion comprising an npn phototransistor PT61 which receives incident radiation 62, and has an emitter PC61 connected in series with first and second n-channel MOSFETs M63 and M64 having respective sources S63/S64, gates G63/G64 and drains D63/D64. The MOSFETs M63 and M64 in combination provide a load for the phototransistor PT61. Although one such would be enough, these two MOSFETs are used in series to lift the output signal from the phototransistor PT61 to a convenient level above earth. The first drain D63 is connected to the emitter PC61 and to the first gate G63; the second drain D64 is connected to the second gate G64 and to the first source S63, and the second source S64 is earthed.

The circuit 60 also includes an output circuit portion comprising a p-channel MOSFET source follower M65 with a source S65, gate G65 and drain D65; the gate G65 is connected to the phototransistor emitter PC61 and to the first MOSFET's drain D63, the drain D65 is earthed, and the source S65 is connected to a p-channel MOSFET switch M66 which is in series with the source follower M65. The switch M66 has a gate G66 and is itself in series with a p-channel floating gate MOSFET MFG67 having a floating gate F67, control gate G67 and charge injector I67; a circle UV67 schematically indicates a window in an overlying layer (not shown) through which ultraviolet light may be applied to insulation (not shown) between the floating gate F67 and the charge injector I67 achieve conduction between them enabling the floating gate to be charged. The switch M66 and MOSFET MFG67 are activated and deactivated by a "Select" voltage applied to the gate G66 and the control gate G67 by means of a common select line 68. Output signals appear on an output line 69.

Operation of the circuit 60 is as follows. In the absence of illumination, the phototransistor PT61 carries a small dark current. Radiation incident on the phototransistor PT61 causes a larger photocurrent $I_{photo}$ to flow as its collector current and also in the first and second MOSFETs M63 and M64 as their common drain-source current. In consequence, a photovoltage appears at the first drain D63 and at the source follower gate G65. When the Select signal is high (5 Volts) the switch M66 and the MOSFET MFG67 are switched off. When the Select signal goes low (zero Volts), the switch M66 and the MOSFET MFG67 are switched on allowing a current to flow in response to the photovoltage as the drain-source current of the source follower M65, the switch M66 and the floating gate MOSFET MFG67 in series. For any particular value of incident radiation intensity and associated photovoltage, the magnitude of this drain-source current is controlled by the channel conductivity of the floating gate MOSFET MFG67, and hence by the charge on the floating gate F67. The floating gate charge is trimmed by using the injector I67 as will be described later in more detail; the charge is trimmed so that, when the gate G66 and the control gate G67 are actuated, a prearranged radiation intensity incident on the phototransistor PT61 gives rise to predetermined source follower output voltage at the source S65, and this voltage is passes to the output line 69. In this way all members of an array of circuits can be trimmed to have like characteristics. In an array, the circuit 60 may be desensitised to the programming of other circuits by taking the Select voltage (control gate voltage) to a high value as will be described later in more detail.

Figure 7:
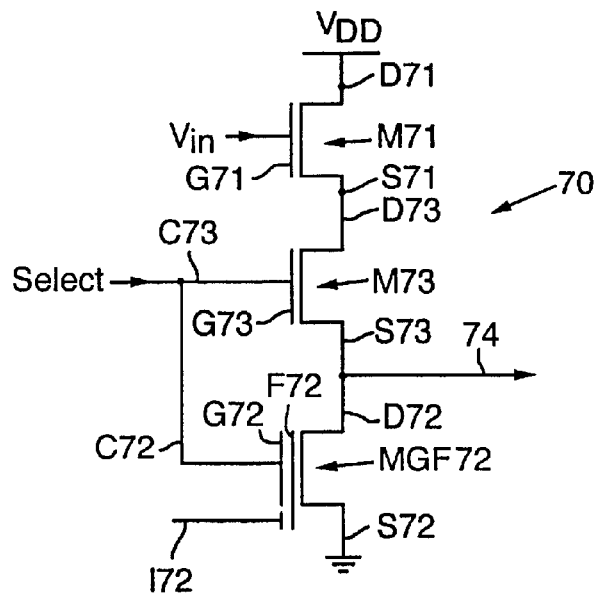

Referring now to FIG. 7, there is shown a further embodiment of the invention comprising a circuit indicated generally by 70. It is of the same general kind as that shown in FIG. 1, ie it enables current to be preset at an output circuit node. It includes an n-channel MOSFET source follower M71 with a source S71, gate G71 and drain D71; the source S71 is connected in series with an n-channel floating gate MOSFET MFG72 via an n-channel MOSFET switch M73. The MOSFETs MFG72 and M73 have respective sources S72/S73, control gates G72/G73 and drains D72/D73, and the former has in addition a floating gate F72 with an injector input I72 and control input C72 to its control gate G72. The switch M73 has a control input C73 connected to the like input C72 of the floating gate MOSFET MFG72, and both are connected to a Select signal source (not shown).

The circuit has an output line 74 connected to the switch source S73 and floating gate MOSFET drain D72.

The circuit 70 operates as follows. The floating gate MOSFET MFG72 acts as a variable current source for the source follower M71 when the switch M73 is held on (Select voltage high). The drain-source current of the source follower M71 is preset by means of the injector I72, which is used to introduce charge on to the floating gate F72 until a required value of current is reached for a prearranged input voltage $V_{in}$ applied to the source follower gate G71. The drain voltage of the floating gate MOSFET MFG72 provides the required output signal at 74. If the circuit 70 is a member of an array, and has been programmed, it may be desensitised to the programming of other circuits by taking the Select voltage (control gate pull-up voltage) to a high value (5 or more Volts) as will be described later in more detail.

Figure 8:
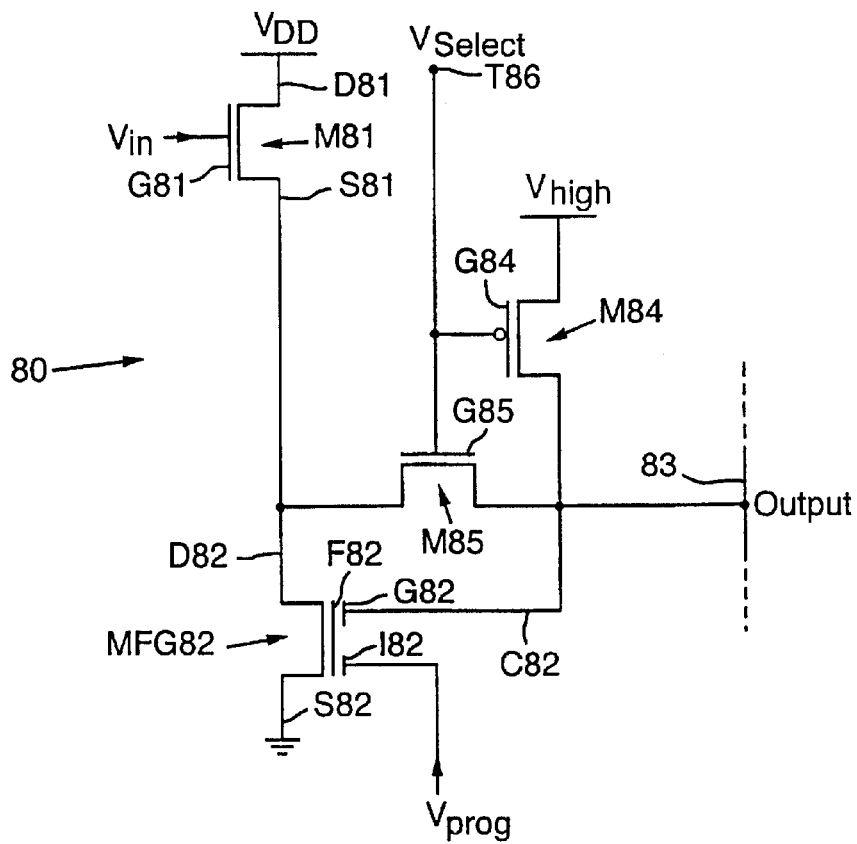
FIG. 8 is a diagram of a circuit with programmable current at an output node and incorporating switches to isolate it from programming intended for other such circuit in an array.

Referring now to FIG. 8, a further circuit of the invention is shown and is indicated generally by 80. It is of the same general kind as that shown in FIG. 7, ie it enables output current to be preset; it is also designed for ease of trimming when a member of an array of such circuits. It includes a first MOSFET M81, an n-channel device connected as a source follower and including a source S81, gate G81 and drain D81; the source S81 is connected in series with a second MOSFET MFG82, an n-channel floating gate device with a source S82, drain D82, floating gate F82 with associated injector I82 and a control gate G82 with input C82. The second MOSFET gate is connected to an output line 83 and thence to a voltage $V_{high}$ via a first switch M84, a p-channel MOSFET with a gate G84; For CMOS technology with 2 μm geometry (minimum feature size), $V_{high}$ is in the range 7–8 Volts at least, and is preferably as high as the circuit 80 can tolerate without damage. This voltage may be too high to avoid circuit damage for smaller geometry sizes, eg sub-micron processes where $V_{DD}$ is 3.3 or less; simple tests would be need to be performed to determine the appropriate voltage, ie producing a number of circuits, applying a range of voltages and determining the voltage at which damage occurs. A second switch M85, an n-channel MOSFET with a gate G85, is connected between the second MOSFET gate G82 and its drain D82. The switch gates G84 and G85 are connected to a terminal T86 to which a selection voltage may be applied.

In normal operating mode, the circuit 80 acts as a source follower, the floating gate MOSFET MFG82 acting as a variable current source for the source follower MOSFET M81. In this mode $V_{select}$ at terminal T86 is set to high potential (5 Volts), which holds the first switch M84 off and the second switch M85 on; this isolates $V_{high}$ from the second gate G82 and connects together the second gate and drain G82/D82. The circuit 80 is also programmed or trimmed in this mode: the drain-source current of the source follower M81 is preset by means of the injector I82, to which a programming voltage $V_{prog}$ is applied to introduce charge on to the floating gate F82; charge is introduced in this way until a required value of output voltage appears at the floating gate MOSFET drain D82 (and also at 83 via switch M85) for a prearranged input voltage $V_{in}$ applied to the first MOSFET gate G81.

When it is required to trim or programme a single circuit in an array, it is necessary to ensure that other circuits in the array are unaffected or "deselected" if they are all connected to a common programming voltage source; this is done in the circuit 80 in deselect mode by setting $V_{select}$ at terminal T86 to low potential (0 Volts), which holds the first switch M84 on and the second switch M85 off. This isolates the source follower M81/MFG82 from the output line 83, and connects $V_{high}$ to the second gate G82; as has been said, $V_{high}$ is 7–8 Volts for 2 µm CMOS geometry, or as high as the circuit can sustain without damage. In deselect mode the floating gate charge is substantially unaffected by application of $V_{prog}$; for practical purposes the circuit 80 is now desensitised to programming or trimming which can proceed in another such member circuit of an array connected to the same source of $V_{prog}$ and switched to select mode.

A method of programming a source follower buffer circuit to provide trimmable pixels in an imaging system will now be described, with reference once more to the circuit 60 of FIG. 6. When an array of circuits 60 is manufactured, each floating gate F67 will have an unknown quantity of charge trapped on it, and therefore the floating-gate potential is unknown. The first step in the programming scheme is a coarse adjustment to remove this fixed charge, preferably minimising ageing of the injector I67. Ultraviolet (UV) light is applied to the window UV67 between the floating gate F67 and injector I67 to induce conduction between them; over a period of time (maybe a few hours) the fixed charge leaks away so that the floating gate F67 ends at the same potential as the injector I67. Alternatively, a circuit with a similar window allowing UV light to be applied to insulation between a floating gate and control gate would allow the floating gate to reach the control gate potential without ageing the injector.

The floating gate potential may alternatively be coarsely adjusted to an approximation to its correct value using the injector I67. In an imaging system, there may be thousands of trimmable pixels, all with final floating gate voltages within a few tens of millivolts of each other, and all initialised by the integrated circuit manufacturing process (and/or UV initialisation) to a point several volts below their desired values. It would be possible—but time consuming—to program each device individually. Instead, all the floating gates are first programmed approximately.

A fairly low voltage (14 Volts for 2 µm CMOS geometry) is applied to the injector I67. If initially the floating gate F67 is at 0 Volts, as would be the case if ultraviolet erasure had been used, then between this gate and the injector I67 there is an effective programming voltage $\Delta V_{inj}$ of 14V. If initially the floating gate F67 is at a voltage $V_{fg}$, the effective programming voltage $\Delta V_{inj}$ is (14V–$V_{fg}$). The programming voltage causes Fowler-Nordheim tunnelling, ie electrons tunnel off the floating gate F67 and the floating gate potential rises reducing $\Delta V_{inj}$. Since Fowler-Nordheim tunnelling is exponentially sensitive to the programming voltage, tunnelling rapidly tails off and programming is self-limiting. The initial programming voltage is chosen so that programming self-limits with a suitable margin of error even for the worst-case combination of the greatest expected field-enhancement (i.e. fastest expected programming rate) and lowest expected desired trimmed floating-gate voltage.

This scheme has the advantage that, because it self-limits, no feedback loop is required to decide whether or not to stop programming. There is therefore no need to use pulses of high injector voltage, since no decisions have to made between each pulse as to whether or not to stop programming. Instead, a constant injector voltage is used which is also quicker since there are no halts to programming as there would be between pulses.

In a final programming operation, each circuit 60 is finely adjusted or trimmed individually, independently of others in the array, which must therefore be deselected so that they are not programmed. Deselection may be achieved by circuitry as described with reference to FIG. 8. Fine trimming should be done in a feedback loop with the programme terminated when the output is correct, as described for example in European Patent No. EP 0758467 corresponding to International Application No. PCT/GB95/00741 published as WO 95/30963.

It is known to use pulses to finely trim floating gate potentials; in EP 0758467 mentioned above many hundreds of pulses were used to trim one particular circuit. However, investigation for the purposes of the present invention has found this to be disadvantageous because it seems to activate slowly decaying charge carrier traps of unknown kind, interface states or surface states perhaps; the observable effect is that the apparent floating gate potential relaxes or drifts over a period of several minutes to several hours. Hence the final programmed value of the floating gate potential is not obtained until minutes or hours after the end of the programming sequence of pulses.

In accordance with another aspect of the invention, it has been found surprisingly that using relatively few (<100) pulses of long duration (>1 second), ie pseudo-continuous voltages, appears to be less prone to activation of slowly decaying charge carrier traps, and the floating gate potential is much less prone to drifting after the end of the programming. In consequence the programming operation is speeded up.

Final programming is therefore preferably achieved using pseudo-continuous voltages. In order to avoid the source follower M65 being required to drive a large capacitance associated with measuring equipment, the output 69 of the circuit 60 is held at an intended end point voltage. The circuit 60 is then programmed by applying a voltage $V_{inj}$ to the injector I67 of the floating gate MOSFET MFG67 until the source-follower output current is zero, implying that the MOSFET M65 is in equilibrium with the applied input (e.g. a uniform light source) giving the desired output. This output voltage during programming is lower that the final trimmed output voltage, because the injector potential also couples through onto the floating gate during programming. A simple feedback loop is needed to equate the desired trimmed output voltage with the equivalent target voltage during programming, similar to that described in EP 0758467 mentioned above.

If the output voltage during programming is $V_{OP}$, the final trimmed output voltage is $V_T$, and $V_T - V_{OP} = \delta V$, an error voltage, then:

$$\delta V = \frac{C_{inj} V_{inj}}{C_{TOT}} \quad (5)$$

where $C_{inj}$ is the capacitance between the floating gate F67 and the injector I67, $C_{TOT}$ is the total floating-gate capacitance.

The error voltage $\delta V$ is therefore dependent on the injector voltage $V_{inj}$ which is known, and on the coupling ratio $$\frac{C_{inj}}{C_{TOT}};$$

although the ratio $$\frac{C_{inj}}{C_{TOT}}$$

will in fact vary slightly from device to device, to a first approximation it may be derived or calculated once and all the floating gates on the chip may be assumed to have the same coupling ratio.

The coupling ratio may be determined experimentally by observing how much the output node voltage moves when a known $V_{inj}$ is applied and removed. $V_{inj}$ is preferably fairly low (eg 5V) to avoid accidentally programming the floating gate F67.

Alternatively, $$\frac{C_{inj}}{C_{TOT}}$$

can be obtained by extracting all relevant capacitance values from the circuit 60, and calculating δV from these extracted values.

δV is taken into account in programming the circuit 60. Simulation can indicate what output current to expect for a known δV, and programming proceeds with this target current as the end point. When the injector voltage is removed, the floating gate should be at or very close to its correct potential and the output current should be very close to zero.

As the floating gate voltage of a selected MOSFET MFG67 increases, if $V_{inj}$ is held constant $\Delta V_{inj}$ decreases and the programming rate falls exponentially. It is therefore better to increase $V_{inj}$ gradually, with the aim of maintaining a constant $\Delta V_{inj}$ and hence a constant programming rate. In fact this is desirable even if a pulsed programming scheme were to be used, otherwise devices which take longer to converge will have smaller $\Delta V_{inj}$ values than those which have already converged and will therefore take longer to reach their required end points.

Ideally, each circuit 60 should be programmed using the same final injector voltage (i.e. the voltage used for the last few millivolts of programming). This is because the injector voltage couples through onto the floating gate, altering its potential. Hence any difference in injector voltage between two devices will lead to different floating gate voltages during programming and hence differences in the programmed floating gate voltages after the injector voltages are removed.

Even if the same injector voltages are used, there will be some differences due to different injector sizes. So for maximum accuracy of trimming the last millivolt or so is preferably done in a feedback loop to adjust the required output voltage. This corresponds to using pulses, but they will be very few (only twenty-four for example) and of long duration (between seconds and tens of seconds long, depending on the size of the applied injector voltage). In normal circumstances there will be less than one hundred pulses each more than 1 second in duration.

As has been said, to program an array of circuits 60 it is necessary to deselect those devices which have already been trimmed to their required outputs. One option is to use the circuitry of FIG. 8, or alternatively to pull the control gate G67 up to a high voltage, ie to the circuit supply voltage $V_{DD}$ or higher as will be described later (gate G67 is at low potential—ie ground—for programming). This voltage couples through to the floating gate and raises its potential by $V_{DD}C_{cgfg}/C_{TOT}$ (parameters are defined with reference to Equation (4)), which is about 2.5V and which reduces $\Delta V_{inj}$ by that amount. In order to avoid reprogramming deselected circuits, $\Delta V_{inj}$ is reduced sufficiently to cause negligible tunnelling even if the injector voltage is applied for a long time. This implies that $\Delta V_{inj}$ must be as low as possible, for example 13V rather than 15V. But this greatly (exponentially) slows down the rate of programming selected devices and may not be practicable if large numbers of circuits are to be trimmed.

An alternative is to increase the deselected floating gate voltage so that the difference $\Delta V_{inj}$ between it and the voltage $V_{inj}$ on the injector I67 is reduced. This can be done by increasing $C_{cgfg}/C_{TOT}$ to allow more of the applied voltage to couple through onto the floating gate, but this is at the expense of increasing the size of the circuit. Another approach is to increase the pull-up voltage applied to the control gate G67 from a circuit supply voltage $V_{DD}$ of 5 Volts as mentioned above to a higher magnitude deselection voltage $V_{desel}$ of 7–8 Volts for example. This has the effect of decreasing $\Delta V_{inj}$ for deselected circuits, and allows larger $\Delta V_{inj}$ for selected circuits and hence faster programming times. The p-channel transistor switch M66 which connects the circuit output voltage to a common line is biased hard off, and is easily able to stand an increase in the voltage across its gate by 2–3 Volts. The high 'off' voltage $V_{desel}$ is only used during programming. In normal operation $V_{desel}$ would be equal to $V_{DD}$ when the circuit output is not being read and 0 Volts when it is.

Integrated circuits or chips were produced each containing two trimmable pixel circuits 60 of the invention each with a phototransistor PT61. Each circuit was trimmed firstly by initialising with ultraviolet light, and then secondly using a continuous and slowly increasing applied injector voltage until the circuit output current was zero at the desired target output voltage. This target voltage was set using feedback so that the final trimmed output voltage (without the injector voltage applied) was correct.

An analysis of the pixel circuit 60 indicates that the error $\Delta V_{out}$ in trimming an output voltage $V_{out}$ will be of the form $$\Delta V_{out} = \frac{2U_T}{\kappa^2}\ln\left(\frac{I_{ph}}{I_{tr}}\right)\Delta\kappa \qquad (6)$$

where $U_T$ is the thermal voltage, κ is the subthreshold slope parameter of the MOSFETs M63 and M64, $I_{ph}$ is the photocurrent and $I_{tr}$ is the photocurrent at which the device was trimmed.

A first pixel circuit on one chip was trimmed at a fairly high ambient light level equivalent to a photocurrent of approximately 10.5 nA. The second was trimmed at a photocurrent approximately a decade lower at 1.5 nA. The results proved to be in the same form as Equation (6), with the error in $V_{out}$ being zero at the trimmed photocurrent level and otherwise proportional to the natural logarithm of the ratio of the photocurrent to the trimmed photocurrent value.

Results were measured for the two pixel circuits on one particular chip over a 5-decade range of photocurrent. This is in agreement with the predicted operating range. At a particular radiation intensity level incident on each pixel circuit, it proved possible to trim the circuit output voltages to match one other to within 0.5 mV.

These results suggest that for maximum accuracy over the widest range, a pixel circuit of the invention should be trimmed in the middle of its operating range, on a logarithmic scale. If alternatively it is intended for use in low ambient light levels, it should be trimmed at that level, which will have the effect of moving most of the errors towards the brightly lit end of the operating range. This would therefore distort the brightest features in a generally poorly-lit scene. If the overall ambient illumination increased away from the level at which the pixels were trimmed, interpixel errors would become more noticeable. Some form of aperture control could then be used to reduce the amount of incident light in brightly-lit situations, in order to recover the desired sensitivity.

What is claimed is:

1. A buffer circuit including a MOSFET power amplifier buffer and a second MOSFET arranged to control current through an input or output node of the circuit, characterized in that the second MOSFET has a floating gate on which charge is storable to change a threshold voltage of the second MOSFET and the circuit has means for storing charge on the floating gate.

2. A buffer circuit according to claim 1 wherein the MOSFET power amplifier is a source follower arranged to buffer a sensor characterized in that the circuit is a member of an array of like buffer circuits each of which is trimmable relative to the others by storage of charge on its respective floating gate to conform to a common array output criterion.

3. A buffer circuit according to claim 1 wherein the MOSFET power amplifier is a source follower arranged to buffer a sensor characterized in that the sensor is a photosensitive element and the circuit is a member of an array of like pixel circuits which are trimmable by storage of charge on respective floating gates to conform to a common output criterion.

4. A buffer circuit according to claim 1 wherein the MOSFET power amplifier is a source follower characterised in that the second MOSFET is arranged to control current through an input circuit node and is connected in series with a sensor through which the said current flows in normal operation.

5. A buffer circuit according to claim 1 wherein the MOSFET power amplifier is a source follower characterised in that the second MOSFET is arranged to control current through an output circuit node and is switchable between selected and non-selected states.

6. A buffer circuit according to claim 1 wherein the MOSFET power amplifier is a source follower characterised in that the second MOSFET has a control gate and the circuit:
   a) is a member of an array of like circuits,
   b) is selectable to store charge on the floating gate during a programming operation, and
   c) is deselectable to avoid storage of charge on the floating gate during a programming operation associated with another circuit of the array.

7. A buffer circuit according to claim 1 wherein the MOSFET power amplifier is a source follower, characterised in that the second MOSFET is arranged to control current through an input circuit node and through a phototransistor connected in series therewith, the second MOSFET having a control gate and a drain which are connected together to provide capacitive coupling between the drain and floating gate via the control gate.

8. A buffer circuit according to claim 7 characterised in that the phototransistor has an emitter connected to the second MOSFET drain, which in turn is connected to a gate of the source follower, and the source follower is in series with a switch actuatable to relay source follower output signals to a circuit output.

9. A buffer circuit including a MOSFET power amplifier buffer and a second MOSFET arranged to control current through an input or output node of the circuit, characterized in that the second MOSFET has a floating gate on which charge is storable to change circuit properties and the circuit has means for storing charge on the floating gate, wherein the MOSFET power amplifier is a source follower, characterised in that the source follower has a gate connected to receive signals from a phototransistor in series with a load comprising at least one diode-connected MOSFET, the second MOSFET is arranged to control current through an output circuit node comprising a source of the source follower and is in series with the source follower and a switch, and the switch is actuatable to select the circuit and relay output signals from it to a circuit output.

10. A buffer circuit including a MOSFET power amplifier buffer and a second MOSFET arranged to control current through an input or output node of the circuit, characterised in that the second MOSFET has a floating gate on which charge is storable to change circuit properties and the circuit has means for storing charge on the floating gate, wherein the MOSFET power amplifier is a source follower, characterised in that the second MOSFET is connected as a load of the source follower and is arranged to control current through an output circuit node comprising a source of the source follower and is in series with a switch, and the switch and second MOSFET are actuatable jointly to select the circuit and provide for output signals from it to pass to an output.

11. A buffer circuit according to claim 1 wherein the MOSFET power amplifier is a source follower, characterised in that it is a member of an array of like circuits which are trimmable by storage of charge on respective floating gates, and the means for storing charge comprises programming means arranged both to store charge on the second MOSFET floating gate in response to programming intended for the circuit and to desensitise it to programming intended for another circuit.

12. A method of trimming a buffer circuit characterised in that it comprises the steps of:
   d) providing the buffer circuit incorporating a MOSFET power amplifier buffer and a second MOSFET arranged to control current through an input or output node of the circuit, the second MOSFET having a floating gate on which charge is storable to change circuit properties;
   e) adjusting the charge stored on the floating gate coarsely by at least one of hot electron injection, Fowler-Nordheim tunnelling and ultraviolet illumination until the circuit provides an output approximating to a required output; and
   f) adjusting the charge stored on the floating gate finely by application of less than one hundred pulses of more than 1 second's duration to an injector or control gate of the second MOSFET.

13. A method according to claim 12 wherein the circuit is a member of an array of like circuits, characterised in that the method includes the step of desensitizing circuits to adjustment when not required by applying to the control gate of the second MOSFET a deselect voltage greater in magnitude than a supply voltage of the circuit.

14. A method according to claim 12 characterised in that the circuit is a pixel circuit and in step (c) is adjusted when the pixel is illuminated with radiation corresponding to the middle of its dynamic range on a logarithmic scale.

15. A method according to claim 12 characterised in that the circuit is a pixel circuit and in step (c) is adjusted when the pixel is illuminated with radiation corresponding to a low ambient light level.

16. A method of trimming a buffer circuit characterised in that it comprises the steps of:
   g) providing the buffer circuit incorporating a MOSFET power amplifier buffer and a second MOSFET arranged to control current through an input or output node of the circuit, the second MOSFET including a floating gate on which charge is storable to change circuit properties; and h) adjusting the charge stored on the floating gate until the circuit has an output voltage which is differs from a required output voltage by an error voltage δV, where:

$$\delta V = \frac{C_{inj} V_{inj}}{C_{TOT}},$$

$C_{inj}$ is the capacitance between the floating gate and a second MOSFET component employed to store charge on the floating gate, $V_{inj}$ is the voltage on that component and $C_{TOT}$ is the total floating-gate capacitance.

17. An array of buffer circuits for buffering respective signal sources, each circuit including:
   a) a MOSFET power amplifier buffer, and
   b) a second MOSFET arranged to control current through a respective input or output circuit node, the second MOSFET having a floating gate on which charge is storable to change its threshold voltage, and wherein the array includes circuitry for selectively storing charge upon second MOSFET floating gates to counteract unwanted variation between characteristics of at least one of signal sources and buffer circuits.

18. An array according to claim 17 wherein each MOSFET power amplifier is a source follower arranged to buffer a signal source comprising a photosensitive element, and the buffer circuits are pixel circuits which are trimmable by application of charge to respective floating gates to conform to a common output criterion.

19. An array according to claim 17 wherein each MOSFET power amplifier is a source follower and each second MOSFET is arranged to control current through a respective input circuit node and is connected in series with a respective signal source through which the said current flows in normal operation.

20. An array according to claim 17 wherein each MOSFET power amplifier is a source follower and each second MOSFET is arranged to control current through a respective output circuit node and is switchable between selected and non-selected states.

21. An array according to claim 17 wherein each circuit includes circuitry for:
   c) introducing charge on to its respective floating gate during a programming operation, and
   d) desensitizing it to introduction of charge on to its respective floating gate during a programming operation associated with another circuit.

22. An array according to claim 21 wherein each circuit includes a switchable connection from its respective floating gate to a source of sufficiently high voltage for deselecting the respective circuit to desensitise it to programming of another circuit.

23. An array according to claim 17 wherein each MOSFET power amplifier is a source follower, each second MOSFET is arranged to control current through a respective input circuit node and through a respective signal source comprising a phototransistor connected in series therewith, and each second MOSFET has a respective control gate and drain which are connected together to provide capacitative coupling between its drain and floating gate via its control gate.

24. An array according to claim 23 characterised in that the phototransistor has an emitter connected to the second MOSFET drain, which in turn is connected to a gate of the source follower, and the source follower is in series with a switch actuatable to relay source follower output signals to a circuit output.

25. An array according to claim 17 wherein each MOSFET power amplifier is a source follower having a gate connected to receive signals from a signal source comprising a phototransistor in series with a load comprising at least one diodeconnected MOSFET, each second MOSFET is arranged to control current through a respective output circuit node comprising a source of the source follower and is in series with the source follower and a switch, and the switch is actuatable to select the circuit and relay output signals from it to a respective circuit output.

26. An array according to claim 17 wherein each MOSFET power amplifier is a source follower and each second MOSFET is:
   e) connected as a load of the source follower,
   f) arranged to control current through a respective circuit output node comprising a source of the source follower, and
   g) in series with a switch, wherein each switch and second MOSFET are actuatable jointly to select the respective circuit and provide for output signals from it to pass to a circuit output.

27. A method for counteracting unwanted variation between characteristics of buffered signal sources in an array thereof, the method including the steps of:
   h) providing for the signal sources to have respective MOSFET power amplifier buffers and respective second MOSFETs arranged to control current through respective input or output circuit nodes, each second MOSFET having a floating gate on which charge is storable to change its threshold voltage, and
   i) selectively storing charge upon second MOSFET floating gates to counteract unwanted variation between characteristics of at least one of signal sources and buffer circuits.

* * * * *